(12) United States Patent
Onodera

(10) Patent No.: US 11,153,989 B2
(45) Date of Patent: Oct. 19, 2021

(54) BURNING STOP APPARATUS AND IMMERSION COOLING SYSTEM

(71) Applicant: FUJITSU LIMITED, Kawasaki (JP)

(72) Inventor: Koichi Onodera, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/910,139

(22) Filed: Jun. 24, 2020

(65) Prior Publication Data

US 2021/0007237 A1 Jan. 7, 2021

(30) Foreign Application Priority Data

Jul. 4, 2019 (JP) .............................. JP2019-125419

(51) Int. Cl.
*H05K 7/20* (2006.01)

(52) U.S. Cl.
CPC ......... *H05K 7/203* (2013.01); *H05K 7/20272* (2013.01); *H05K 7/20381* (2013.01)

(58) Field of Classification Search
CPC .............. H05K 7/203; H05K 7/20272; H05K 7/20381
USPC ......................................................... 361/699
See application file for complete search history.

(56) References Cited

U.S. PATENT DOCUMENTS

| 3,680,359 | A * | 8/1972 | Lynch | H01F 27/402 |
|---|---|---|---|---|
| | | | | 73/23.21 |
| 4,112,737 | A * | 9/1978 | Morgan | G01N 7/10 |
| | | | | 73/19.02 |
| 4,772,980 | A * | 9/1988 | Curtis | G06F 1/20 |
| | | | | 361/679.02 |
| 6,494,617 | B1 * | 12/2002 | Stokes | G01N 33/28 |
| | | | | 336/57 |
| 7,636,233 | B2 * | 12/2009 | Callsen | H02B 7/06 |
| | | | | 174/520 |
| 9,513,275 | B2 * | 12/2016 | Pruente | G01N 33/2841 |
| 9,599,653 | B2 * | 3/2017 | Kim | G01N 33/0004 |
| 10,653,043 | B2 * | 5/2020 | Enright | H05K 7/20318 |
| 2011/0132579 | A1 * | 6/2011 | Best | H05K 7/20772 |
| | | | | 165/104.31 |
| 2014/0216688 | A1 * | 8/2014 | Shelnutt | G06F 1/20 |
| | | | | 165/104.13 |

(Continued)

FOREIGN PATENT DOCUMENTS

| JP | H08-213782 A | 8/1996 |
|---|---|---|
| JP | 2017-183344 A | 10/2017 |
| WO | 2016/088280 A1 | 6/2016 |

OTHER PUBLICATIONS

EESR—Extended European Search Report dated Nov. 17, 2020 for corresponding European Patent Application No. 20183176.5.

*Primary Examiner* — Anatoly Vortman
(74) *Attorney, Agent, or Firm* — Fujitsu Patent Center

(57) ABSTRACT

A burning stop apparatus includes: a detector that detects a gas component generated by burning occurring in an electronic device immersed in a coolant stored in a liquid immersion tank; a first pipe that introduces the gas component in the liquid immersion tank to the detector; a second pipe that returns the gas component introduced to the detector into the liquid immersion tank; and a breaker that cuts off supply of power to the electronic device when a detection value of the detector is higher than a preset first threshold value for concentration of the gas component.

8 Claims, 17 Drawing Sheets

(56) References Cited

U.S. PATENT DOCUMENTS

| | | | |
|---|---|---|---|
| 2014/0260529 A1* | 9/2014 | Pruente | G01N 33/2841 73/19.11 |
| 2015/0245539 A1* | 8/2015 | Pelletier | G06F 1/206 361/679.53 |
| 2017/0280587 A1 | 9/2017 | Watanabe et al. | |
| 2017/0303443 A1 | 10/2017 | Inano et al. | |
| 2017/0354061 A1 | 12/2017 | Saito | |
| 2019/0077275 A1* | 3/2019 | Capati | B60L 58/26 |
| 2019/0166726 A1 | 5/2019 | Tung et al. | |

\* cited by examiner

BURNING STOP APPARATUS AND IMMERSION COOLING SYSTEM

CROSS-REFERENCE TO RELATED APPLICATION

This application is based upon and claims the benefit of priority of the prior Japanese Patent Application No. 2019-125419, filed on Jul. 4, 2019, the entire contents of which are incorporated herein by reference.

FIELD

The embodiments discussed herein are related to a burning stop apparatus and an immersion cooling system.

BACKGROUND

Immersion cooling apparatuses have heretofore been known in which an electronic device is immersed in a coolant stored in a liquid immersion tank to cool the electronic device.

Related art is disclosed in Japanese Laid-open Patent Publication No. 2017-183344.

SUMMARY

According to an aspect of the embodiments, a burning stop apparatus includes: a detector that detects a gas component generated by burning occurring in an electronic device immersed in a coolant stored in a liquid immersion tank; a first pipe that introduces the gas component in the liquid immersion tank to the detector; a second pipe that returns the gas component introduced to the detector into the liquid immersion tank; and a breaker that cuts off supply of power to the electronic device when a detection value of the detector is higher than a preset first threshold value for concentration of the gas component.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
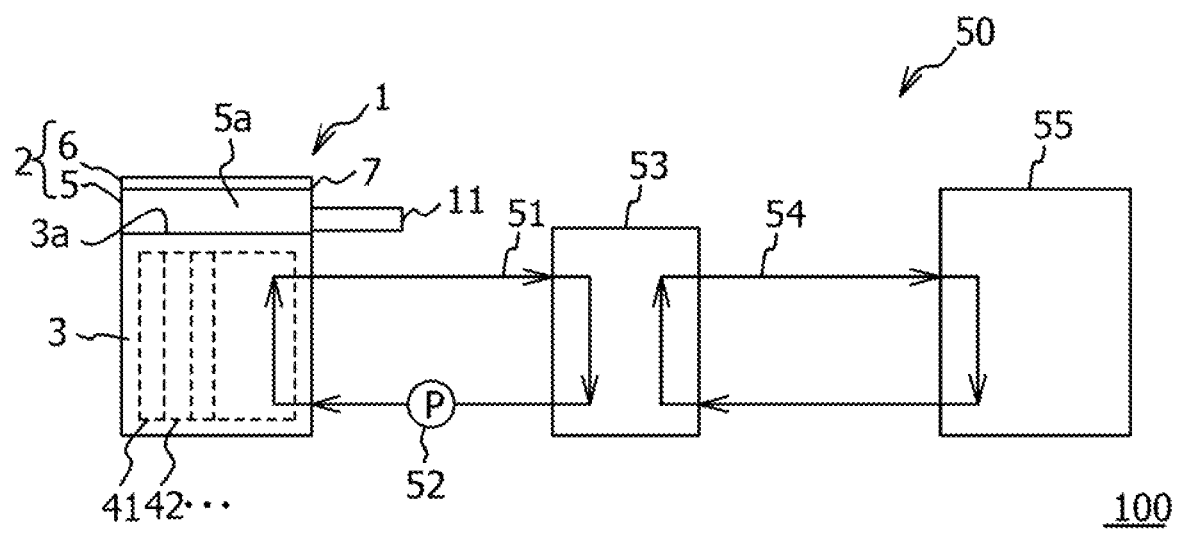
FIG. 1 is a schematic diagram illustrating a schematic configuration of an immersion cooling system incorporating a burning stop apparatus according to a first embodiment.

Meanwhile, in the electronic device, for example, short circuit of a ceramic capacitor mounted on its printed circuit board or the like (hereinafter referred to as "burning") may occur. It is desirable to detect the occurrence of such a phenomenon and take some measure as soon as possible. The electronic device may include a temperature sensor, and be capable of determining whether burning is occurring based on the measurement value of this temperature sensor. However, the temperature sensor is, in many cases, provided near an inlet in the housing of the electronic device or near a main heat generating component such as a central processing unit (CPU). For this reason, if burning occurs at a position far from the temperature sensor, it may be impossible to detect the temperature increase due to the occurrence of the burning. Detection of burning in the electronic device is not taken into account.

In one aspect, an object of the disclosure of the present description is to detect the occurrence of burning in an electronic device that is being cooled by an immersion cooling apparatus and to stop the burning.

Hereinafter, embodiments of the present disclosure will be described with reference to the accompanying drawings. In the drawings, the dimensions, ratios, or the like of parts are not necessarily illustrated to be completely consistent with those of the actual parts. Also in some drawings, for convenience of description, elements actually present are omitted or the elements are exaggerated in dimensions compared to the actual elements.

First Embodiment

First, a first embodiment will be described with reference to FIGS. 1 to 5. Referring to FIG. 1, an immersion cooling system 100 includes an immersion cooling apparatus 1, a coolant cooling apparatus 50, and a burning stop apparatus 11.

Figure 2:
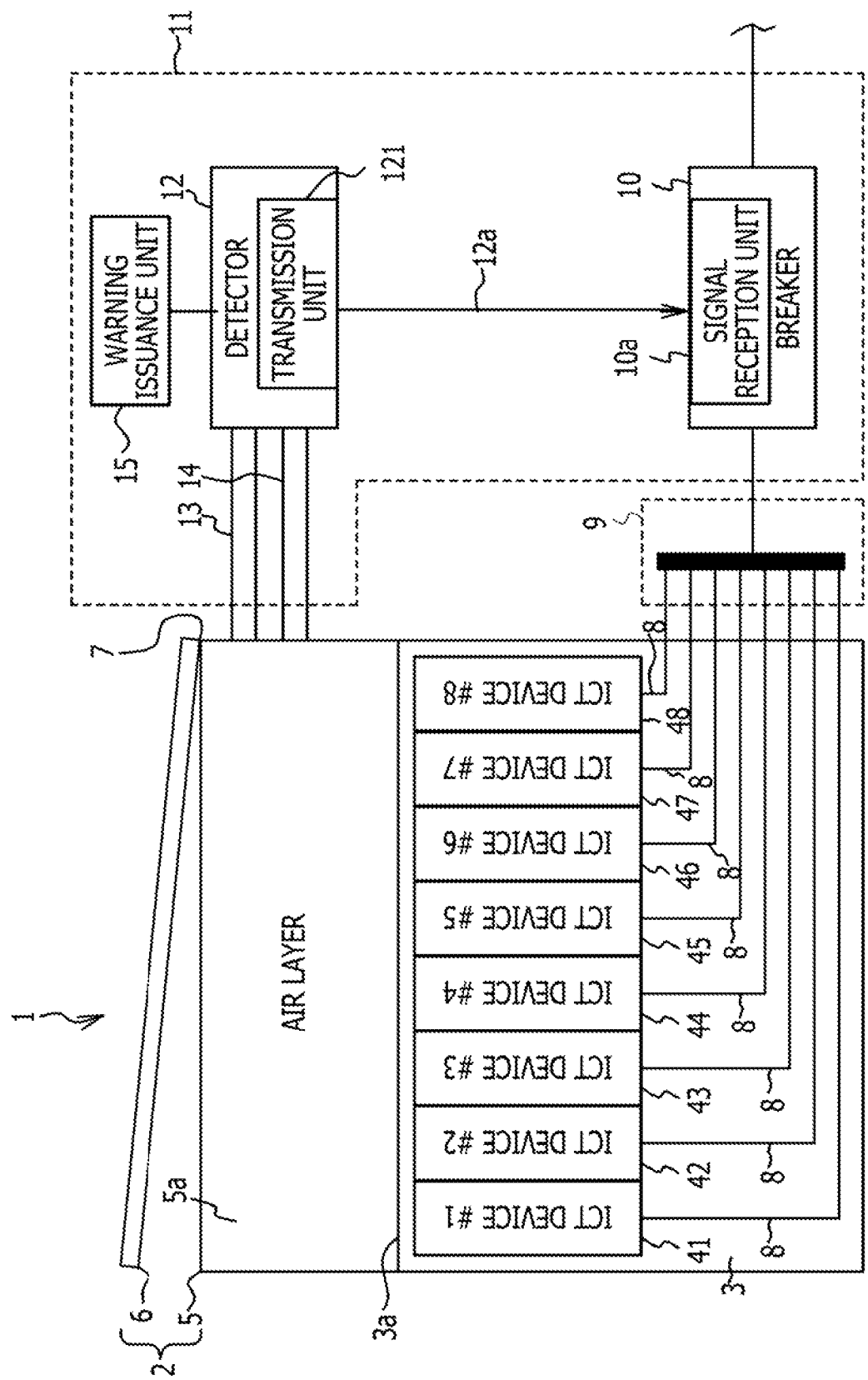
FIG. 2 is a schematic diagram illustrating how the burning stop apparatus according to the first embodiment is incorporated in a liquid immersion tank storing a coolant in which ICT devices are immersed.

Referring to FIGS. 1 and 2, the immersion cooling apparatus 1 includes a liquid immersion tank 2. A coolant 3 is stored in the liquid immersion tank 2. A plurality of information and communications technology (ICT) devices 41 to 48 are immersed in the coolant 3. The ICT devices 41 to 48 are each an example of an electronic device.

The liquid immersion tank 2 has a liquid immersion tank main body and a lid 6 attached to the upper end of the liquid immersion tank main body 5 via a hinge 7 so as to be openable and closable. The burning stop apparatus 11 is coupled to the liquid immersion tank 2. When a gas component is generated by burning occurring in any one of the ICT devices 41 to 48, the burning stop apparatus 11 cuts off the supply of power to the ICT devices 41 to 48 to stop the burning. The burning stop apparatus 11 will be described later in detail.

Figure 3:
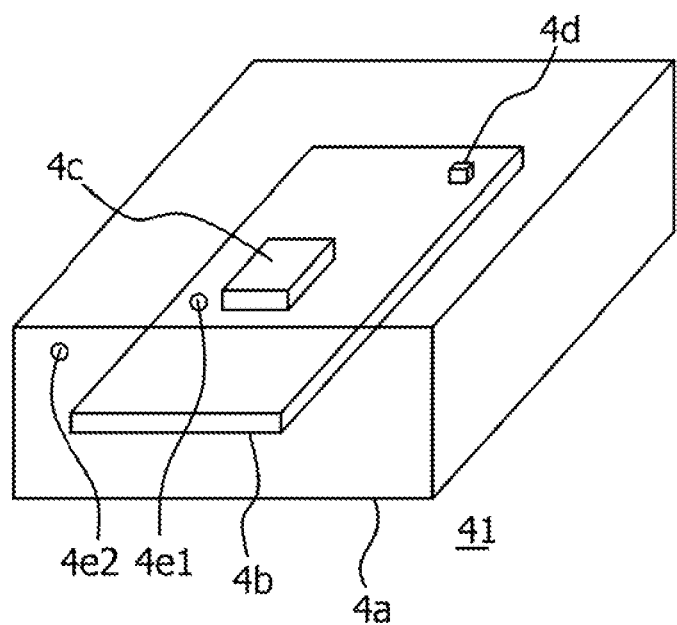
FIG. 3 is a schematic view illustrating a schematic configuration of an ICT device.

The ICT devices 41 to 48 in the present embodiment are the same. Hence, in the following description, the ICT device 41 will be representatively described. FIG. 3 illustrates the ICT device 41. Referring to FIG. 3, the ICT device 41 includes a printed circuit board 4b inside a housing 4a. Various electronic components such as a central processing unit (CPU) 4c, a ceramic capacitor 4d, and so on are mounted on the printed circuit board 4b. The ICT device 41 includes a first temperature sensor 4e1 near the CPU 4c, which is a heat generating component, and a second temperature sensor 4e2 near an opening portion provided in the housing 4a. When the measurement value of the first temperature sensor 4e1 or the second temperature sensor 4e2 exceeds a predetermined value, the supply of power to the ICT device 41 is cut off. The ICT devices 42 to 48 are also such that the supply of power is cut off based on the measurement values of the first temperature sensor 4e1 and the second temperature sensor 4e2 included in them.

In the ICT device 41, damage such as cracking of the ceramic capacitor 4d may occur, for example. Such damage causes a rise in ambient temperature, which will lead to burning. Here, if the installation positions of the first temperature sensor 4e1 and the second temperature sensor 4e2 are far from where the burning is occurring, it is difficult to determine the occurrence of the burning based on the measurement values of the first temperature sensor 4e1 and the second temperature sensor 4e2. This may lead to a failure to cut off the supply of power to the ICT device 41 although the burning is occurring. When burning occurs, a gas component may be generated from the printed circuit board 4b.

Power cables 8 are coupled to the ICT devices 41 to 48, respectively. Each power cable 8 extends from a power distributor 9. The power distributor 9 is coupled to a power source, and a breaker 10 is provided between the power distributor 9 and the power source. The breaker 10 includes a signal reception unit 10a. The signal reception unit 10a is coupled to a detector 12 via a wiring 12a, and trips based on a signal transmitted from a transmission unit 121 included in the detector 12. Since the breaker 10 and the detector 12 are included in the burning stop apparatus 11 to be described later, they will be described in more detail in the description of the burning stop apparatus 11.

In the present embodiment, a fluorine-based insulating coolant is employed as the coolant 3, but a different coolant may be employed. The coolant 3 is a liquid (liquid coolant) that has an electrical insulation property and thermal conductivity and easily evaporates at room temperature. "Room temperature" refers to, for example, the yearly average temperature in the area where the immersion cooling apparatus 1 is installed. Examples of this coolant 3 include Fluorinert (trademark of 3M Company) manufactured by 3M Company, and Novec (trademark of 3M Company) manufactured by 3M Company. A liquid surface 3a of the coolant 3 is located above the ICT devices 41 to 48 so that the entirety of the ICT devices 41 to 48 is immersed in the coolant 3. Above the liquid surface 3a inside the liquid immersion tank main body 5 is an air layer 5a.

When burning occurs in any of the ICT devices 41 to 48 immersed in the coolant 3, a gas component may be generated from the coolant 3 due to the burning.

The coolant cooling apparatus 50 is coupled to the liquid immersion tank 2. The coolant cooling apparatus 50 includes a heat exchanger 53 and water cooling equipment 55. The liquid immersion tank 2 is coupled to the heat exchanger 53 via a first circulation path 51. A pump 52 is disposed in the first circulation path 51, and the pump 52 is caused to operate to circulate the coolant 3 between the liquid immersion tank 2 and the heat exchanger 53. The heat exchanger 53 and the water cooling equipment 55 are coupled to each other via a second circulation path 54. Water cooled by the water cooling equipment 55 circulates through the second circulation path 54. The water cooled by the water cooling equipment 55 exchanges heat with the coolant 3 in the heat exchanger 53, thereby cooling the coolant 3.

Referring again to FIG. 2, the burning stop apparatus 11 is coupled to the liquid immersion tank 2. The burning stop apparatus 11 includes the detector 12, a first pipe 13, a second pipe 14, and a warning issuance unit 15. The burning stop apparatus 11 also includes the breaker 10, which is provided between the power distributor 9 and the power source. Even when it is difficult to determine the occurrence of burning based on the measurement values of the first temperature sensor 4e1 and the second temperature sensor 4e2, the burning stop apparatus 11 properly detects the occurrence of the burning and cuts off the supply of power to the ICT devices 41 to 48 collectively in order to stop the burning. The supply of power to the ICT devices 41 to 48 is collectively cut off since it is difficult to identify in which ICT device the burning is occurring.

The detector 12 is a sensor that detects a gas component generated from the printed circuit board 4b or the coolant 3 by burning occurring in any of the ICT devices 41 to 48. It suffices that the detector 12 is capable of detecting the concentration of the gas component, and a publicly known detector may be used. The detector 12 includes the transmission unit 121, which transmits a measurement value.

The first pipe 13 is coupled to the liquid immersion tank 2. More specifically, the first pipe 13 is coupled to, for example, the position of the air layer 5a in the liquid immersion tank main body 5. The first pipe 13 introduces the gas component in the liquid immersion tank 2 to the detector 12. The second pipe 14 is also coupled to the liquid immersion tank 2 in a similar manner to the first pipe 13. More specifically, the second pipe 14 is coupled to, for example, the position of the air layer 5a in the liquid immersion tank main body 5. The second pipe 14 returns the gas component introduced to the detector 12 into the liquid immersion tank 2. The first pipe 13 and the second pipe 14 may be coupled to the lid 6.

As described above, the air layer 5a and the detector 12 are coupled to each other by the first pipe 13 and the second pipe 14, and thus air containing the gas component circulates between the air layer 5a and the detector 12. Specifically, the gas component introduced to the detector 12 does not get released to the outside but remains in a space communicating with the air layer 5a, for example. Therefore, the concentration of the gas component in the air layer 5a gradually rises. By attaching the detector 12, the first pipe 13, and the second pipe 14 as a burning detection device to an existing liquid immersion tank, it is possible to detect burning occurring in the liquid immersion tank.

In the present embodiment, a fan or the like that actively circulates air between the air layer 5a and the detector 12 is not included. The air layer 5a and the detector 12 are coupled to each other by the first pipe 13 and the second pipe 14, and a continuous space is formed therebetween. For this reason, if burning continues with the lid 6 closed, the concentration of the gas component in this space rises. The detector 12 detects this concentration.

In the present embodiment, a second threshold value and a first threshold value larger than the second threshold value are set for the concentration of the gas component. When the concentration of the gas component becomes higher than the second threshold value, the warning issuance unit 15 issues a warning. When the concentration of the gas component becomes higher than the first threshold value, the breaker 10 trips, thereby cutting off the supply of power to the ICT devices 41 to 48. At this time, an alarm may be sounded. The threshold values are set as described above since it is desired to continue the operation of the ICT devices 41 to 48 as long as possible. Specifically, it is possible to cut off the supply of power, for example, immediately after the detector 12 detects the gas component. By providing the threshold values, however, it is possible to cut off the supply of power only when the burning continues and the concentration of the gas component becomes high. By providing the second threshold value, which is lower than the first threshold value, and causing the warning issuance unit 15 to issue a warning before the breaker 10 is caused to trip, it is possible to back up or evacuate the data handled by the ICT devices 41 to 48 before the supply of power is cut off. In other words, it is possible to secure a work time for backing up or evacuating the data handled by the ICT devices 41 to 48, for example.

By setting the first threshold value and the second threshold value, it is possible to avoid erroneous detection by the detector 12. It is usually assumed that the detector 12 reacts to various kinds of gases or the like other than the target gas component to be detected in the present case. For this reason, predetermined operations are performed when the first threshold value and the second threshold value are exceeded, in order to avoid issuance of a warning and execution of trip of the breaker 10 in response to detection of a gas not originating from burning.

In the present embodiment, the first pipe 13 and the second pipe 14 are coupled to the position of the air layer 5a since the concentration of the gas component in the air is detected. However, the first pipe 13 and the second pipe 14 may be coupled to a position where the coolant 3 is stored. In this case, the detector 12 detects the concentration of the gas component in the coolant 3.

Next, operation of the above burning stop apparatus 11 will be described with reference to a flowchart illustrated in FIG. 4 and a graph illustrated in FIG. 5.

First, in step S1, it is determined whether a temperature abnormality is detected. The temperature abnormality detection in step S1 is performed based on the measurement values of the first temperature sensor 4e1 and the second temperature sensor 4e2. If a positive determination (YES) is made in step S1, the operation proceeds to step S2. On the other hand, if a negative determination (NO) is made in step S1, the operation proceeds to step S3. In step S2, the supply of power is cut off only for the ICT device with the first temperature sensor 4e1 or the second temperature sensor 4e2 having detected the temperature abnormality among the ICT devices 41 to 48. In the case where a temperature abnormality is detected, the condition is such that it is possible to identify in which ICT device the burning is occurring. Hence, only the ICT device in which the burning is occurring is stopped, and the operation of the other ICT devices is continued. By cutting off the supply of power to the ICT device in which the burning is occurring, it is possible to stop the burning and thus avoid spread of the burning to other neighboring ICT devices.

In step S3, the detector 12 detects the concentration of the gas component. For convenience of description, in the flowchart illustrated in FIG. 4, the concentration detection is performed in step S3 after a negative determination is made in step S1. However, the detector 12 keeps performing the concentration detection while the immersion cooling apparatus 1 is in operation. The detection value obtained by the detector 12 is sent to the signal reception unit 10a of the breaker 10 via the transmission unit 121.

In step S4, which is performed after step S3, the breaker 10 determines whether the detection value received by the signal reception unit 10a is larger than the preset second threshold value. While the second threshold value may be set as desired, it is set at 5 ppm in the present embodiment. When the ICT devices 41 to 48 have no burning occurring therein and are operating normally, the concentration of the gas component is 0 ppm, as in the state before the occurrence of an abnormality in FIG. 5.

If a negative determination (NO) is made in step S4, the processing from step S3 is repeated. If burning is occurring occurs in any one of the ICT devices 41 to 48, then, as illustrated in FIG. 5, the concentration of the gas component gradually rises after the occurrence of the abnormality, specifically, after the occurrence of the burning, for example. Then, the concentration of the gas component reaches the second threshold value. As a result, a positive determination (YES) is made in step S4. If a positive determination is made in step S4, the operation proceeds to step S5.

In step S5, the warning issuance unit 15 issues a warning. The warning may be any form of warning. For example, a notification indicating that the concentration of the gas component has been rising may be displayed on a display, or a warning sound such as the sound of a buzzer may be generated. A warning lamp may be turned on. In the present embodiment, a warning lamp is turned on. When a warning is issued, a person in charge of maintenance and management may proceed with work such as backing up the data handled by the ICT devices 41 to 48.

In step S6, which is performed after step S5, the breaker 10 determines whether the detection value received by the signal reception unit 10a is larger than the preset first threshold value. While the first threshold value may be set as desired, it is set at 12 ppm in the present embodiment.

If a negative determination (NO) is made in step S6, the processing from step S3 is repeated. If burning is occurring in any of the ICT devices 41 to 48, the concentration of the gas component further rises, as illustrated in FIG. 5. As a result, a positive determination (YES) is made in step S6. If a positive determination is made in step S6, the operation proceeds to step S7.

In step S7, the breaker 10 trips, thereby collectively cutting off the supply of power to the ICT devices 41 to 48. The supply of power to all ICT devices 41 to 48 is cut off since it is impossible to identify the ICT device in which the burning is occurring. Consequently, the burning occurring in one of the ICT devices stops. This makes it possible to stop the generation of the gas component and to avoid spread to the burning to the ICT devices in which burning has not yet occurred.

In the present embodiment, the breaker 10 make comparisons with threshold values. However, the detector 12 may transmit a signal from the transmission unit 121 along with information indicating that the detection value is the first threshold value. In this case, the breaker 10 is caused to trip when the signal reception unit 10a receives the information indicating that the detection value is the first threshold value.

The supply of power to the ICT devices 41 to 48 is cut off, but power continues to be supplied to peripheral devices such as the detector 12 and the pump 52.

As described above, the burning stop apparatus 11 according to the present embodiment is capable of detecting the occurrence of burning in any of the ICT devices 41 to 48 cooled by the immersion cooling apparatus 1 and of stopping the burning. Since the burning stop apparatus 11 stops burning based on detection of the gas component, it is possible to detect the occurrence of burning and stop the burning even when it is impossible to detect the occurrence of the burning with the first temperature sensor 4e1 or the second temperature sensor 4e2. By stopping the burning, it is possible to keep the amount of the gas component generated low. Since the amount of the gas component generated is low, no special measure for removing the gas component is to be used.

Second Embodiment

Figure 6:
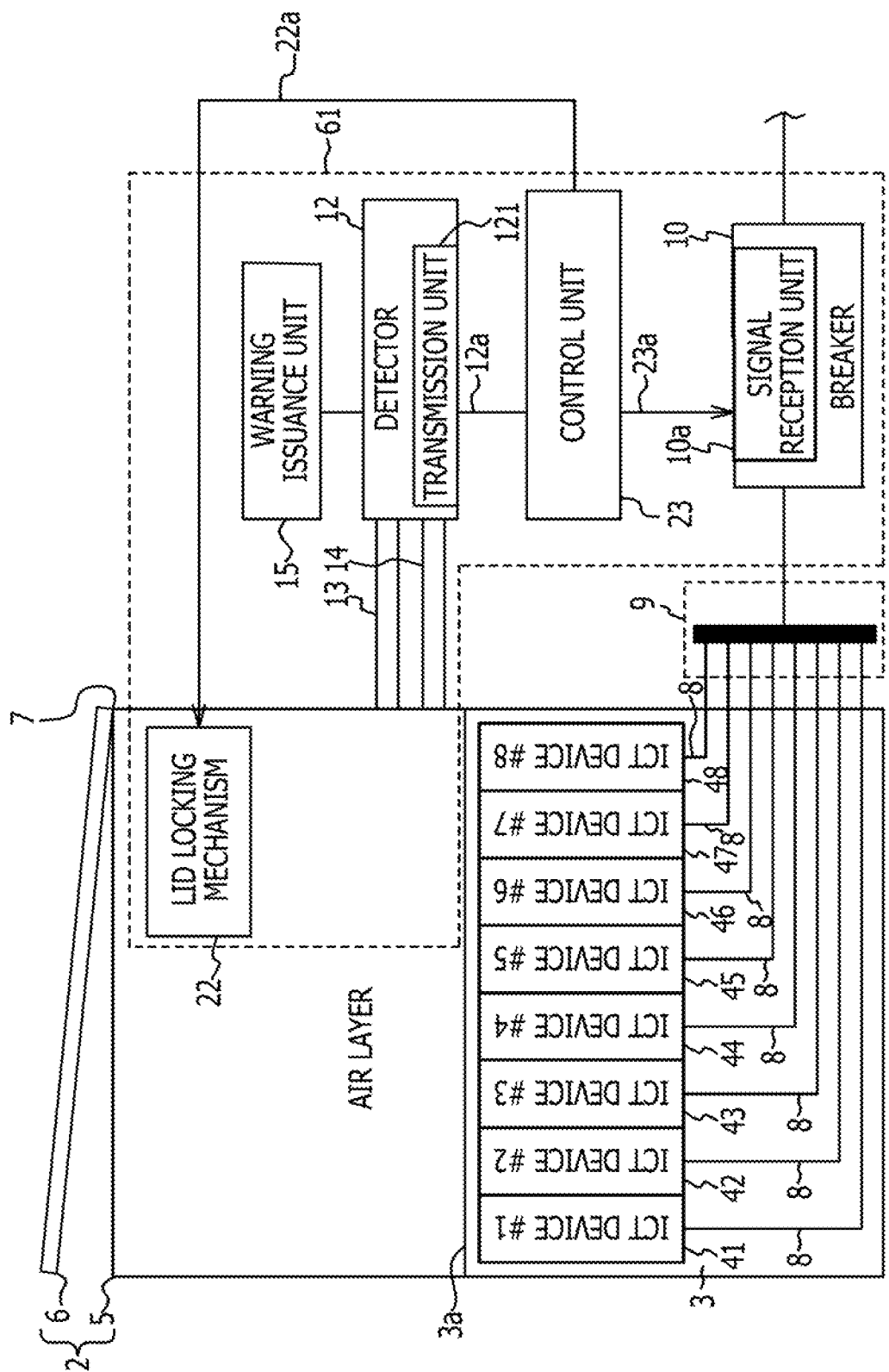
FIG. 6 is a schematic diagram illustrating how a burning stop apparatus according to a second embodiment is incorporated in a liquid immersion tank storing a coolant in which ICT devices are immersed.
Figure 7:
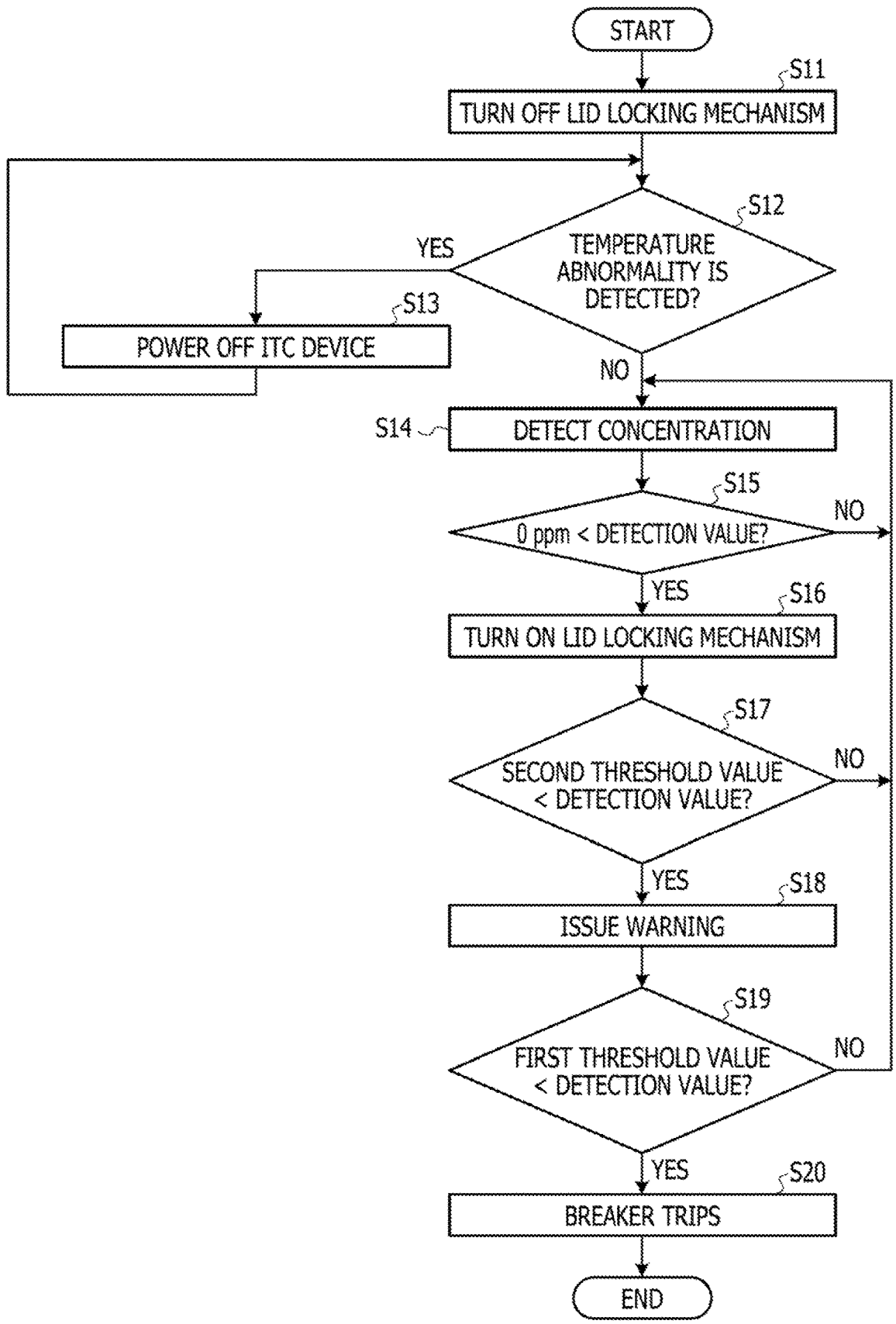
FIG. 7 is a flowchart illustrating an example of operation of the burning stop apparatus according to the second embodiment.

Next, a second embodiment will be described with reference to FIGS. 6 and 7. Referring to FIG. 6, in the second embodiment, a burning stop apparatus 61 is included instead of the burning stop apparatus 11 according to the first embodiment. The burning stop apparatus 61 further includes, in addition to the elements of the burning stop apparatus 11, a lid locking mechanism 22 and a control unit 23 as a controller. Since the other elements are not different from those in the first embodiment, the identical elements are denoted by the same reference numerals in the drawings, and detailed description thereof is omitted.

The lid locking mechanism 22 is electrically driven, and is electrically coupled to the control unit 23 via a wiring 22a. When the lid locking mechanism 22 is put into an on state, the lid 6 is put into an unopenable state. The control unit 23 is electrically coupled to the detector 12 via the wiring 12a and electrically coupled to the breaker 10 via a wiring 23a.

The control unit 23 causes the breaker 10 to trip based on the information of the detection value received from the transmission unit 121 of the detector 12. The breaker 10 is the same as that in the first embodiment, and the breaker 10 itself is capable of tripping. The breaker 10 may thus be directly coupled to the detector 12 without the control unit 23 therebetween.

The control unit 23 switches the lid locking mechanism 22 between the on state and an off state based on the information on the detection value received from the transmission unit 121 of the detector 12. Specifically, when the detector 12 detects the gas component even slightly, the control unit 23 puts the lid locking mechanism 22 into the on state to thereby keep the lid 6 from being opened, for example.

If the lid 6 is open while burning is occurring in the liquid immersion tank 2 and the gas component is being generated, the gas component will be released to the atmosphere. If the gas component is released to the atmosphere, the concentration of the gas component in the liquid immersion tank 2 will not rise, and thus the breaker 10 will not trip and the supply of power will be maintained. This leads to a possibility that the burning will not stop but spread. Thus, in the present embodiment, when the detector 12 detects the gas component, the lid 6 is kept from being opened on the assumption that burning may be occurring. When a predetermined concentration is then reached, the breaker 10 is caused to trip.

Next, an example of the operation of the burning stop apparatus 61 according to the second embodiment will be described with reference to a flowchart illustrated in FIG. 7.

First, in step S11, the lid 6 is closed, but the lid locking mechanism 22 is turned off, specifically, the lid 6 is left in an unlocked state, for example. In step S12, it is determined whether a temperature abnormality is detected. Step S12 and step S13, which is performed when a positive determination is made in step S12, are identical to steps S1 and S2 in the first embodiment illustrated in FIG. 4, and detailed description thereof is therefore omitted.

In step S14, which is performed when a negative determination is made in step S12, the detector 12 detects the concentration of the gas component. In step S15, which is performed after step S14, the control unit 23 determines whether the detection value is larger than 0 ppm. If a positive determination is made in step S15, the operation proceeds to step S16. On the other hand, if a negative determination is made in step S15, the processing from step S14 is repeated.

In step S16, the control unit 23 outputs a signal for putting the lid locking mechanism 22 into the on state. As a result, the lid 6 is locked and kept from being opened. Hence, inadvertent opening of the lid 6 will be avoided. This in turn avoids release of the gas component in the liquid immersion tank 2 to the atmosphere, so that the concentration of the gas component in the liquid immersion tank 2 will rise.

Figure 4:
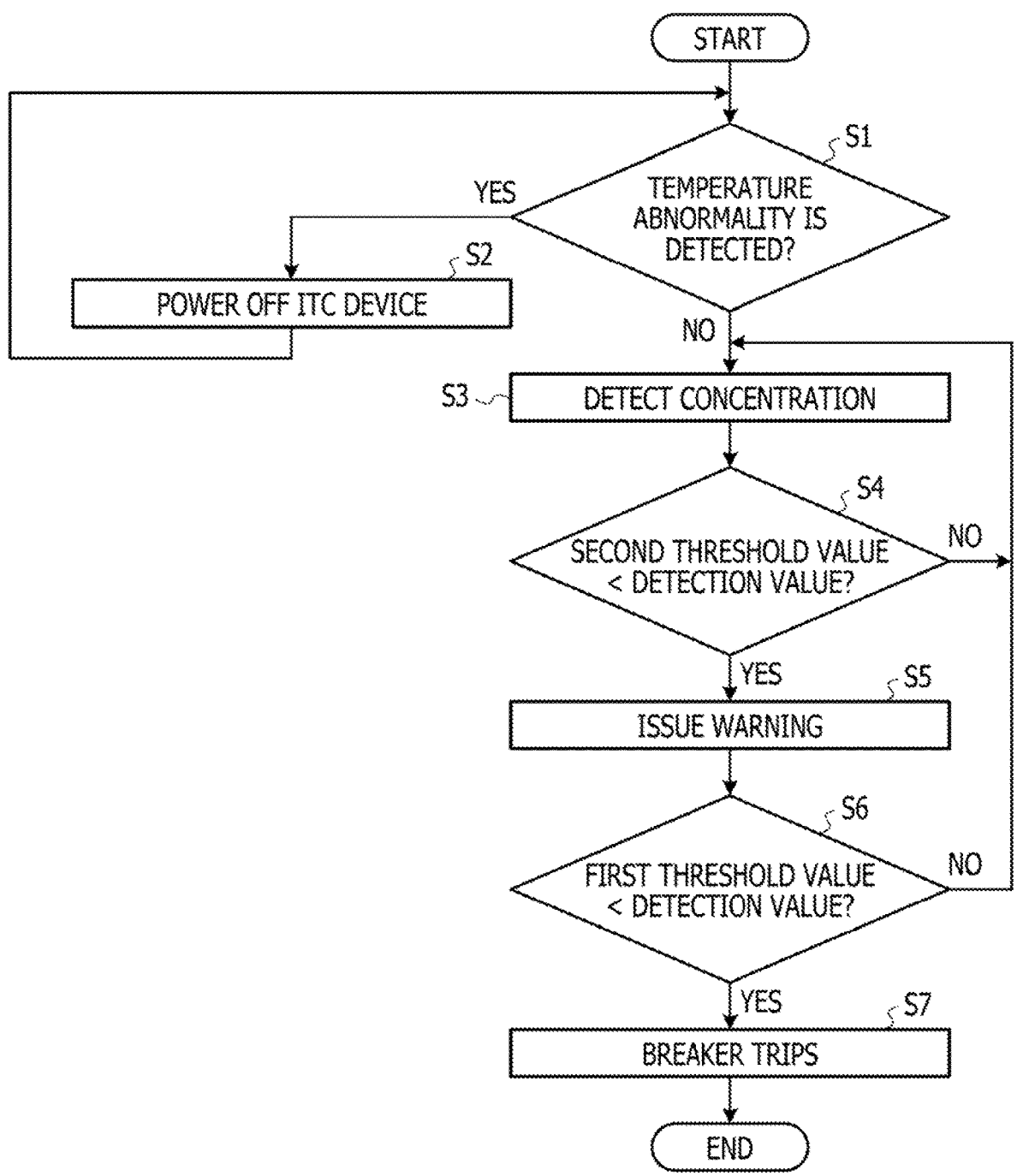
FIG. 4 is a flowchart illustrating an example of operation of the burning stop apparatus according to the first embodiment.
Figure 5:
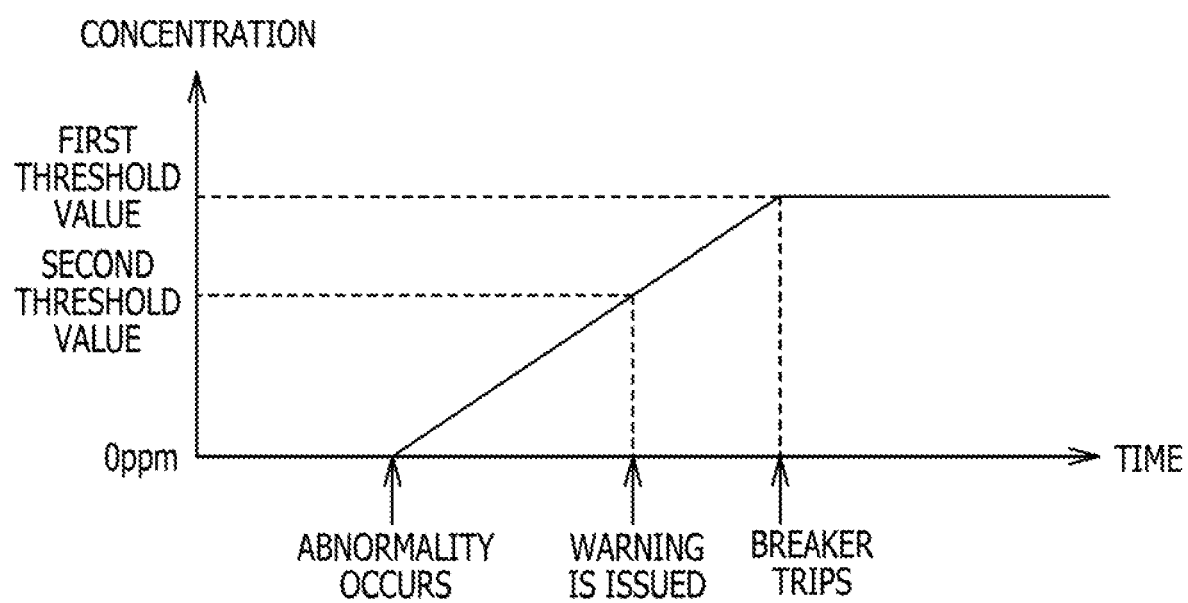
FIG. 5 is an example of a graph illustrating time-series change in the gas concentration inside the liquid immersion tank, and the operation of the burning stop apparatus associated with the time-series change.

Steps S17 to S20, which are performed after step S16, are basically identical to steps S4 to S7 in the first embodiment illustrated in FIG. 4, and detailed description thereof is therefore omitted.

According to the present embodiment, when burning occurs with the lid 6 closed, the lid locking mechanism 22 keeps the lid 6 from being opened, thereby avoiding opening of the lid 6 and thus release of the gas component to the atmosphere. Hence, the concentration of the gas component in the liquid immersion tank 2 rises and the concentration reaches the first threshold value, so that the breaker 10 trips. As a result, the burning stops.

Third Embodiment

Figure 8:
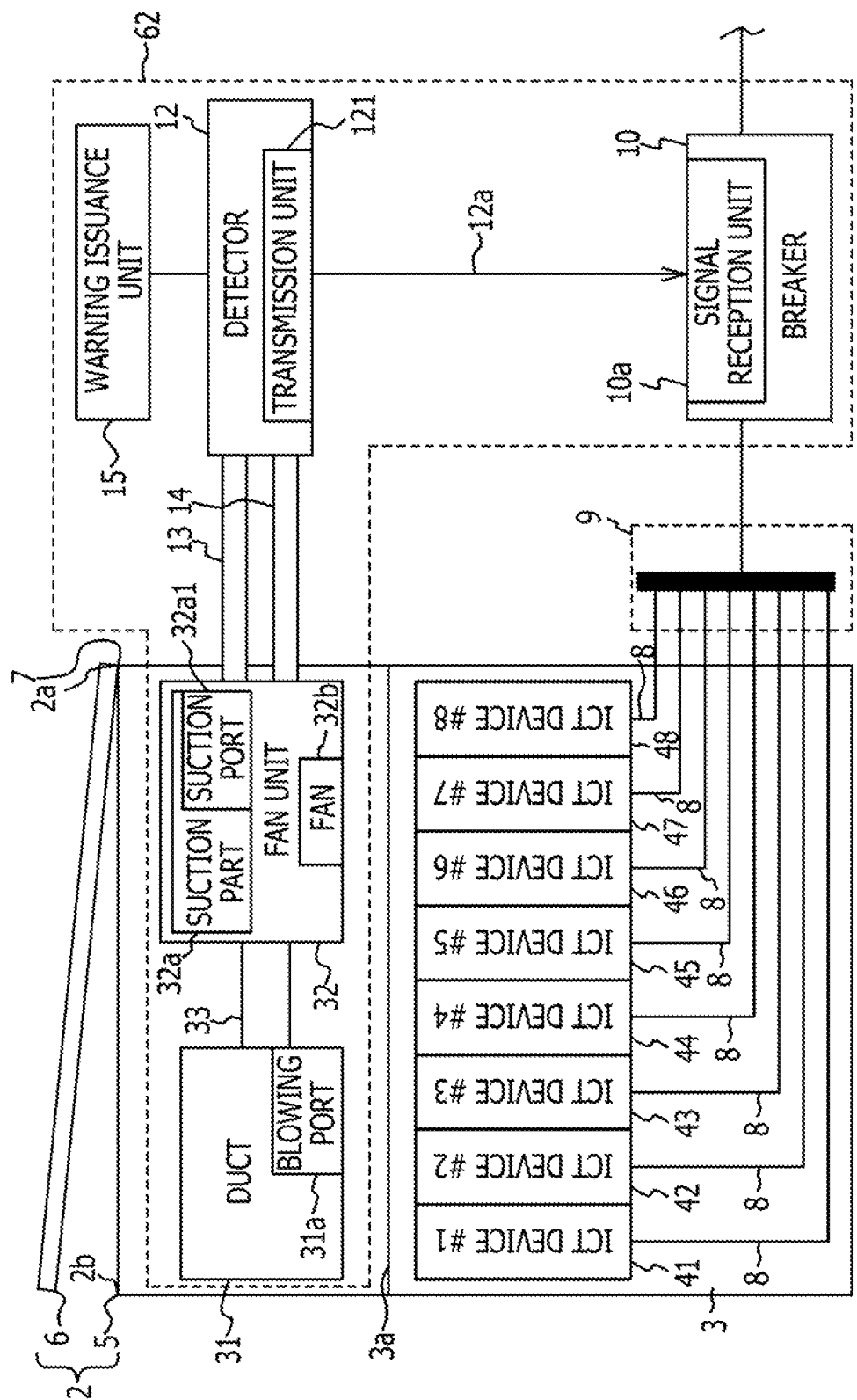
FIG. 8 is a schematic diagram illustrating how a burning stop apparatus according to a third embodiment is incorporated in a liquid immersion tank storing a coolant in which ICT devices are immersed.

Next, a third embodiment will be described with reference to FIGS. 8 to 12. Referring to FIG. 8, in the third embodiment, a burning stop apparatus 62 is included instead of the burning stop apparatus 11 according to the first embodiment. The burning stop apparatus 61 includes, in addition to the elements of the burning stop apparatus 11, a duct 31 including blowing ports 31a, a fan unit 32, and fans 32b for circulating air between the duct 31 and the fan unit 32. The fan unit 32 includes a suction part 32a having a hollow inside, and the fans 32b are incorporated in this suction part 32a. Since the other elements are not different from those in the first embodiment, the identical elements are denoted by the same reference numerals in the drawings, and detailed description thereof is omitted.

The liquid immersion tank 2 has the lid 6 attached to one edge 2a of the upper end of the liquid immersion tank main body 5 via the hinge 7 so as to be openable and closable. In the first embodiment, if burning occurs with the lid 6 open, the gas component generated by the burning will be released to the atmosphere. The result is assumed to be that the breaker 10 does not trip and the supply of power to the ICT devices 41 to 48 is not cut off although the burning is occurring. Thus, in the present embodiment, the gas component is captured even with the lid 6 open, and the breaker 10 is caused to trip when the concentration of the gas component exceeds a threshold value.

Figure 9:
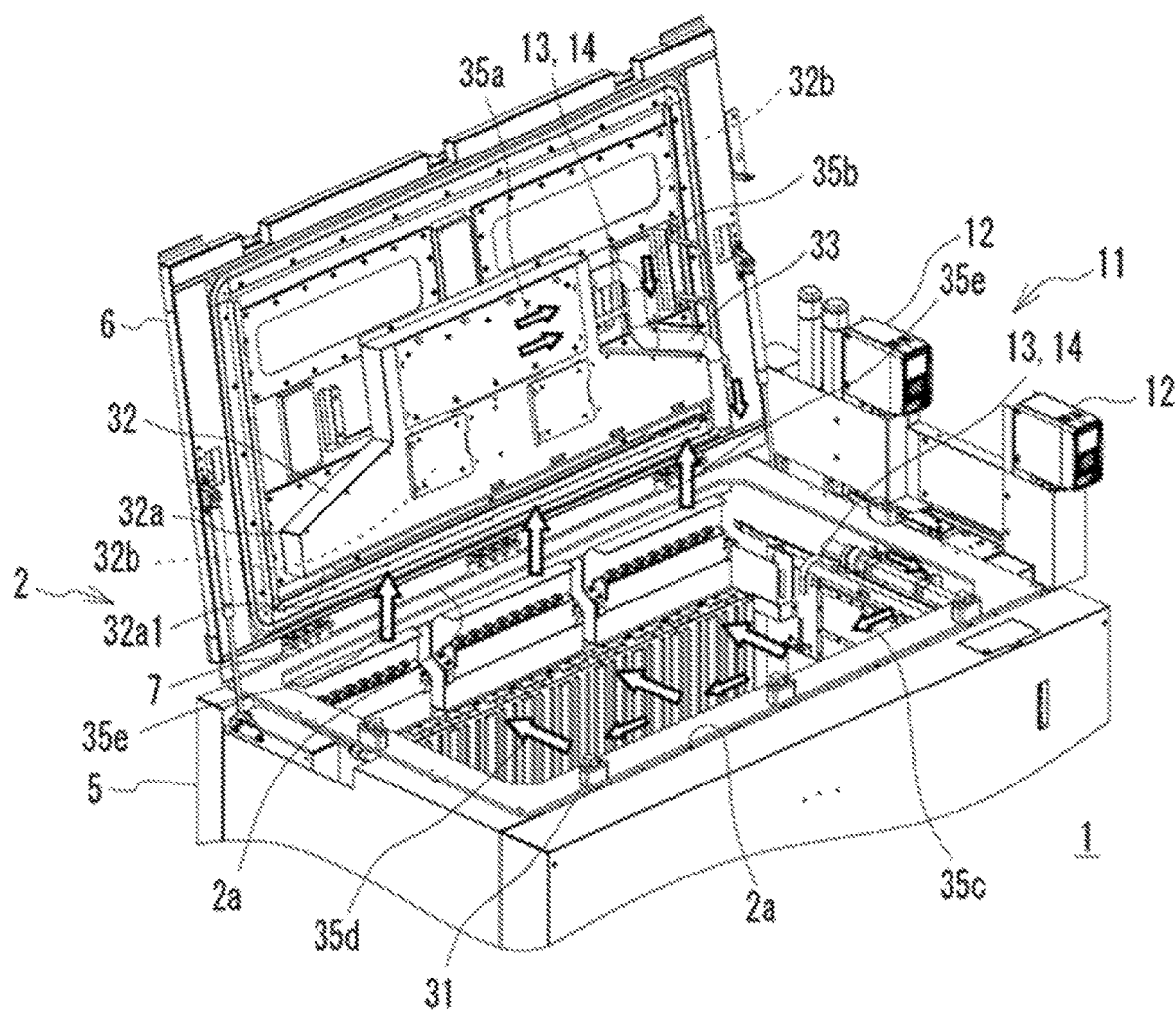
FIG. 9 is a perspective view illustrating the liquid immersion tank and a lid in which the burning stop apparatus according to the third embodiment is incorporated.

Referring to FIG. 9, the duct 31 is disposed at the other edge 2b of the upper end of the liquid immersion tank main body 5 facing the one edge 2a, to which the lid 6 is attached. The duct 31 includes the blowing ports 31a, through which air is to be blown toward the one edge 2a.

Figure 11:
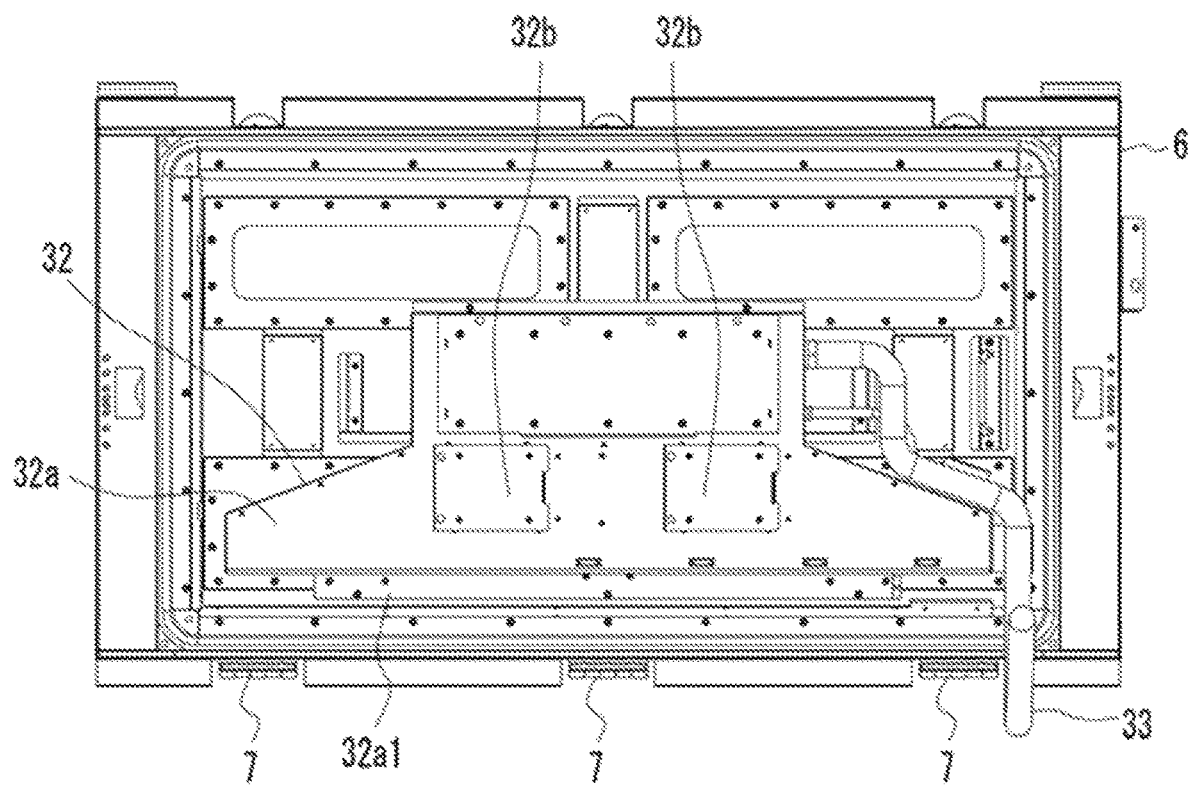
FIG. 11 is a front view illustrating the inner wall surface of a lid on which a suction part is provided.

In FIG. 8, the fan unit 32 is depicted at a position separated from the lid 6 for convenience of drawing. The fan unit 32 according to the present embodiment is provided on the inner wall surface of the lid 6, as illustrated in FIG. 9. The suction part 32a, which is a part of the fan unit 32, is provided on the inner wall surface of the lid 6 and, as illustrated in FIG. 11, includes a suction port 32a1 with an opening facing downward when the lid 6 is opened in a substantially upright position. The fans 32b are incorporated in the suction part 32a. As the fans 32b operate, air is sucked in from the suction port 32a1. The fans 32b operate when the lid 6 is open. The fans 32b may be configured to automatically operate when the lid 6 is opened but, in the present embodiment, a person in charge of maintenance manually turns on the fans 32b to cause the fans 32b to operate when opening the lid 6.

Figure 12:
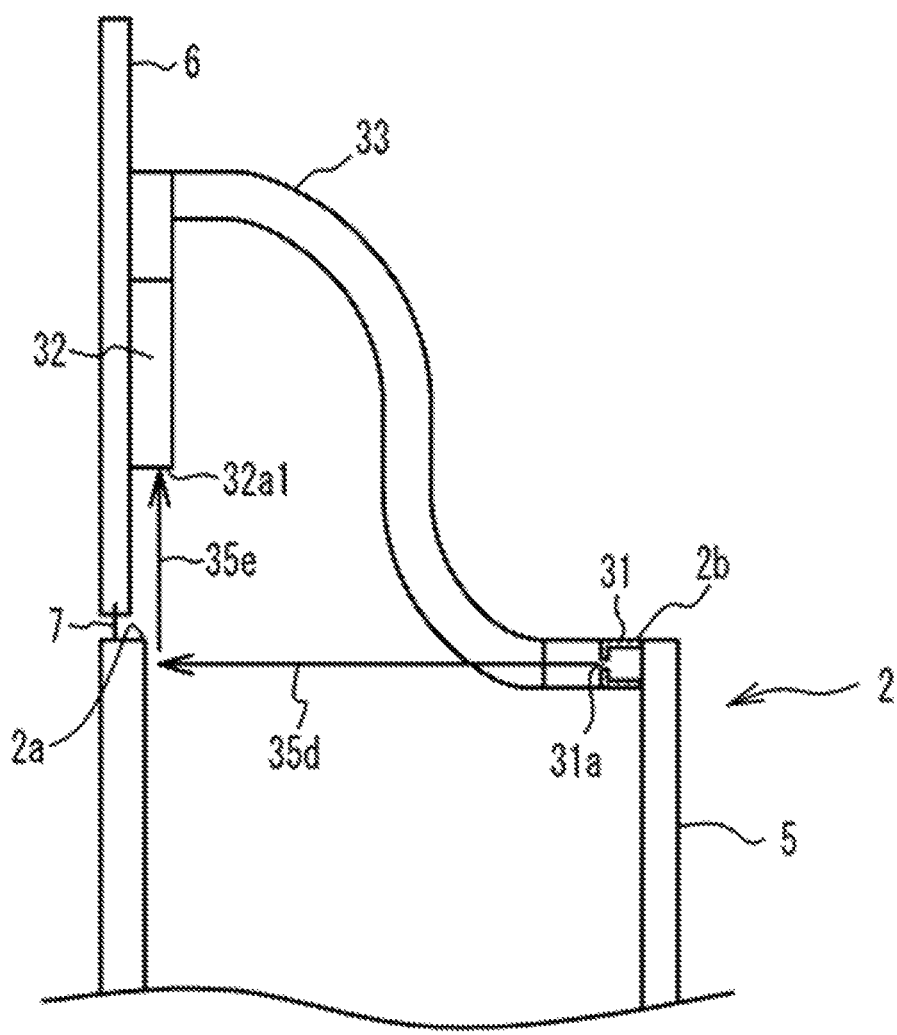
FIG. 12 is an explanatory diagram schematically illustrating a state where the lid of the liquid immersion tank is open.

The duct 31 and the fan unit 32 are coupled to each other by a pipe 33. As the fans 32b operate in the fan unit 32, air flows as indicated by arrows 35a illustrated in FIG. 9, and the air flows into the duct 31 through the pipe 33 as indicated by arrows 35b. The air then spreads throughout the duct 31 as indicated by arrows 35c illustrated in FIG. 9, and the air is blown out from the blowing ports 31a as indicated by arrows 35d illustrated in FIGS. 9 and 10. Referring to FIG. 12, the air blown out from the blowing ports 31a flows toward the one edge 2a, at which the suction part 32a is provided, as indicated by an arrow 35d. Such a flow of air functions like an air curtain covering the opening portion of the liquid immersion tank main body 5. Therefore, the gas component generated in the liquid immersion tank 2 is captured in the flow of air as indicated by the arrows 35d and then moves with that flow. The flow of air as indicated by the arrows 35d is sucked into the suction part 32a through the suction port 32a1 as indicated by arrows 35e. As the fans 32b operate in this manner, an air circulation path is formed. Subsequently, the gas component is gradually taken into the flow, so that the concentration of the gas component in the circulating air rises.

In the present embodiment too, the first pipe 13 and the second pipe 14 are provided. The first pipe 13 is provided so as to introduce the air circulated by the fans 32b to the detector 12. Specifically, in the present embodiment, the suction part 32a and the detector 12 are coupled to each other by the first pipe 13, for example. In the present embodiment, the second pipe 14 is combined with the first pipe 13 by a cladding tube and provided between the suction part 32a and the detector 12. Here, the second pipe 14 does not have to be coupled to the air circulation path. For example, the second pipe 14 may be coupled to the liquid immersion tank main body 5 at a position lower than the air flow indicated by the arrows 35d. This is because as long as the air containing the gas component is returned into the liquid immersion tank main body 5, it is possible for that air to join the air flow again and it is thus possible to raise the concentration of the gas component in the circulating air.

Figure 10:
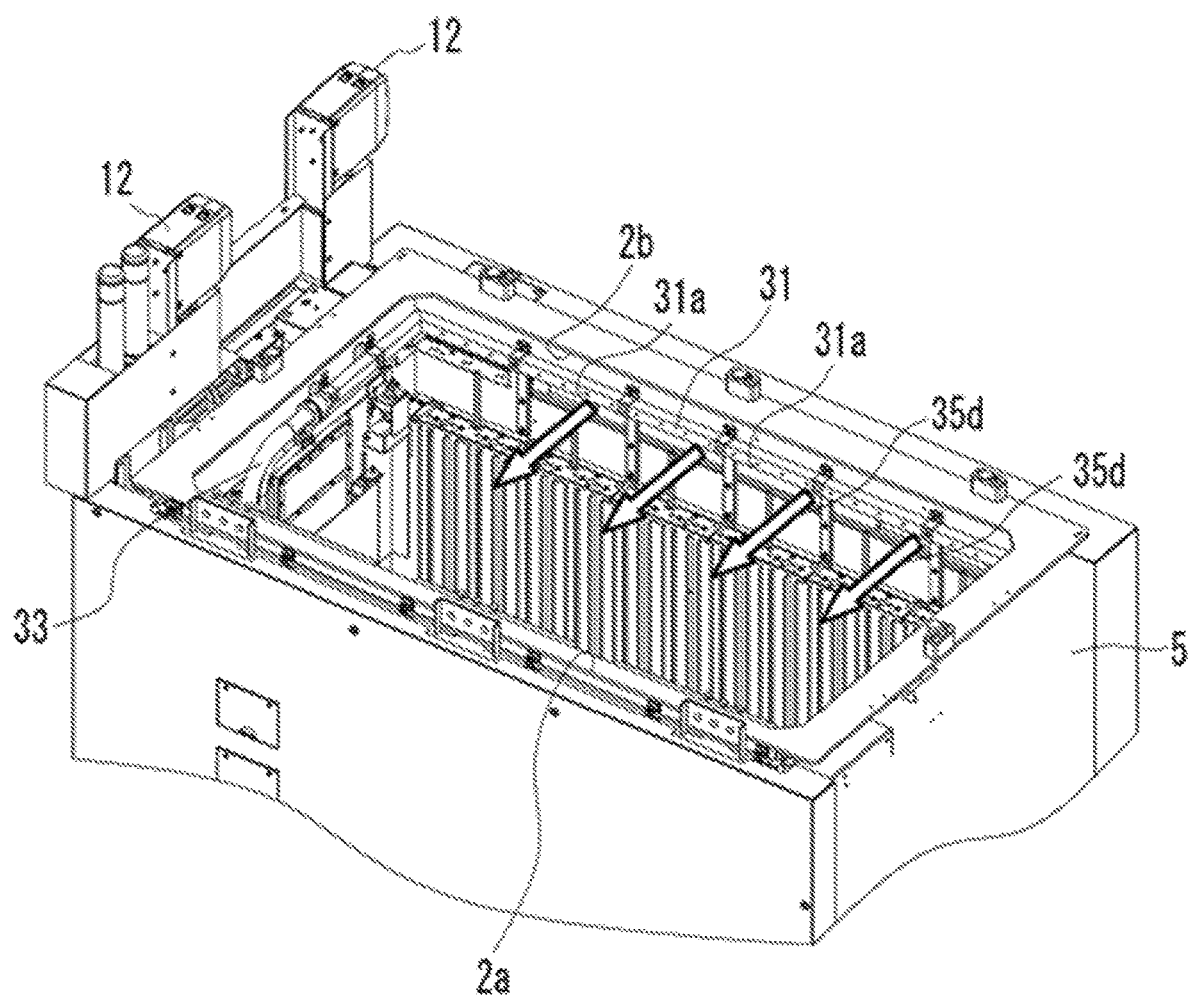
FIG. 10 is a perspective view illustrating the liquid immersion tank with the lid removed.

Referring to FIGS. 9 and 10, two detectors 12 are provided, as a measure to continue the detection of the gas component when a failure occurs in one of the detectors 12.

According to the present embodiment, even if burning occurs with the lid 6 open, the generated gas component will not be released to the atmosphere, and the concentration of the gas component flowing to the detector 12 rises gradually. When the concentration of the gas component reaches the first threshold value, the breaker 10 trips, so that the supply of power to the ICT devices 41 to 48 is cut off and the burning stops.

The installation position of the suction part 32a is not limited to the inner wall surface of the lid 6. For example, the suction part 32a may be provided near the upper end of the liquid immersion tank main body 5. In short, it suffices that the suction part 32a is provided at such a position as to be capable of capturing the gas component in the liquid immersion tank main body so as not to release the gas component to the atmosphere. The installation positions of the fans 32b are not limited to the inside of the suction part 32a, and it suffices that the fans 32b are provided in the air circulation path.

Fourth Embodiment

Figure 13:
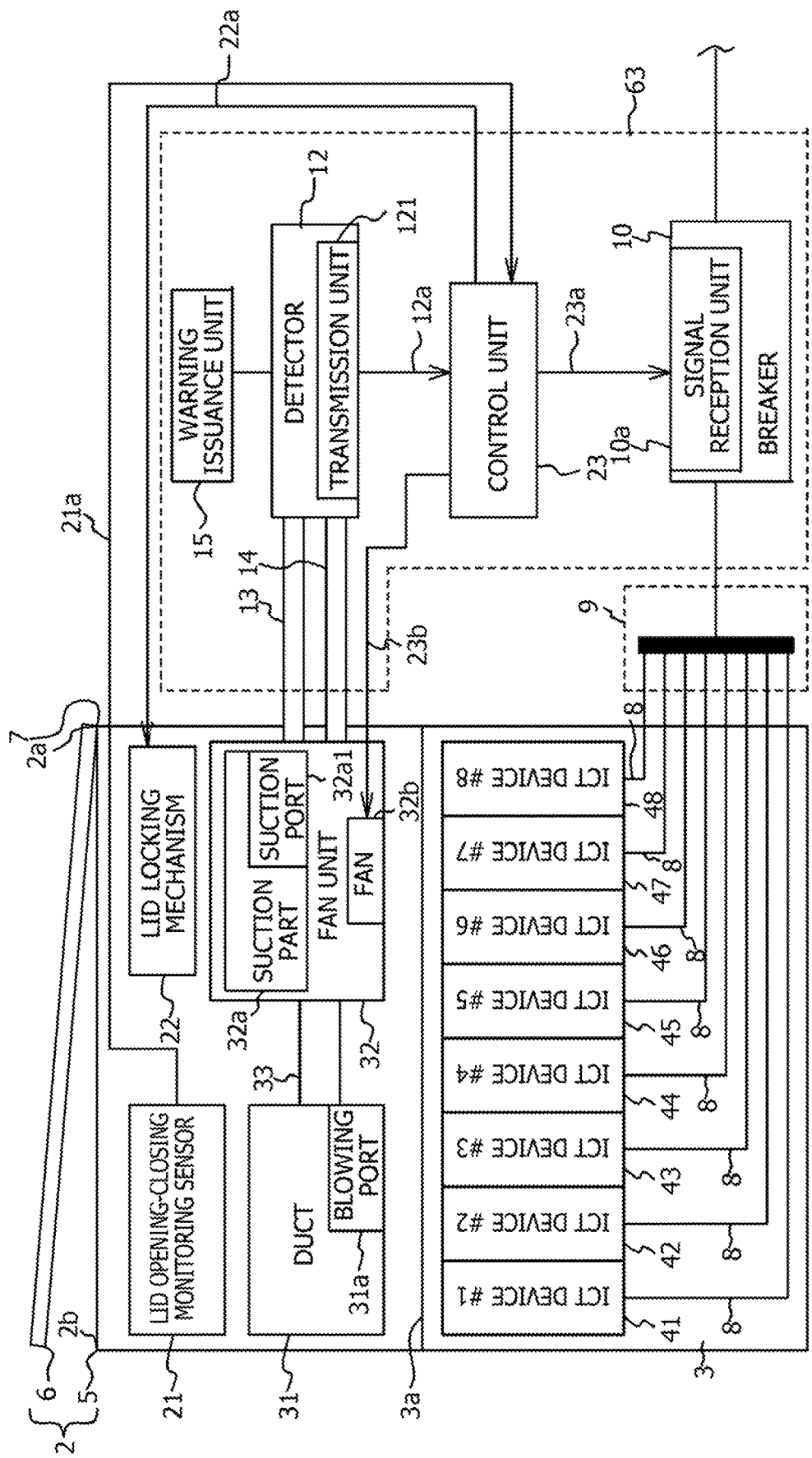
FIG. 13 is a schematic diagram illustrating how a burning stop apparatus according to a fourth embodiment is incorporated in a liquid immersion tank storing a coolant in which ICT devices are immersed.
Figure 14A:
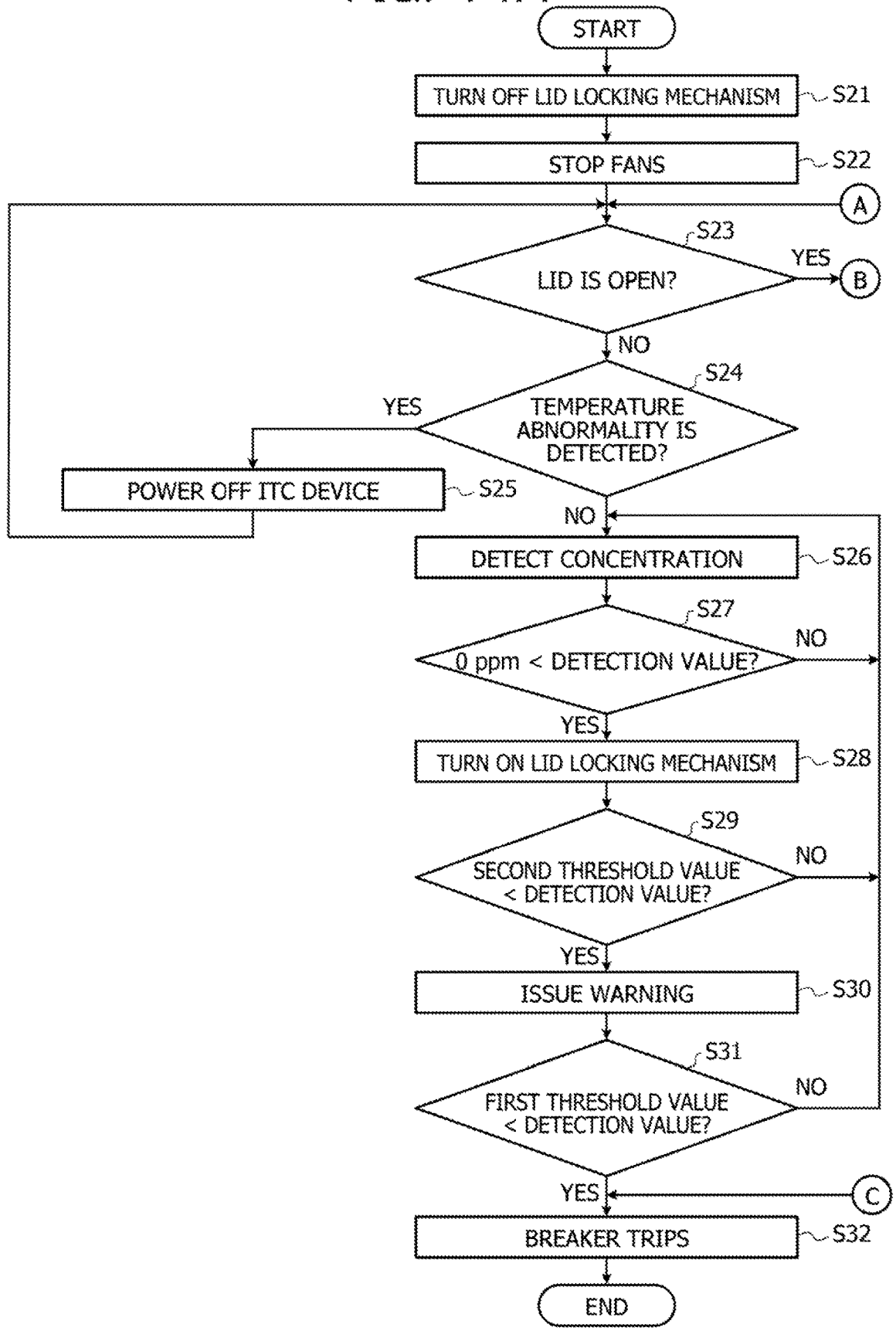
FIGS. 14A and 14B are a flowchart illustrating an example of operation of the burning stop apparatus according to the fourth embodiment.
Figure 14B:
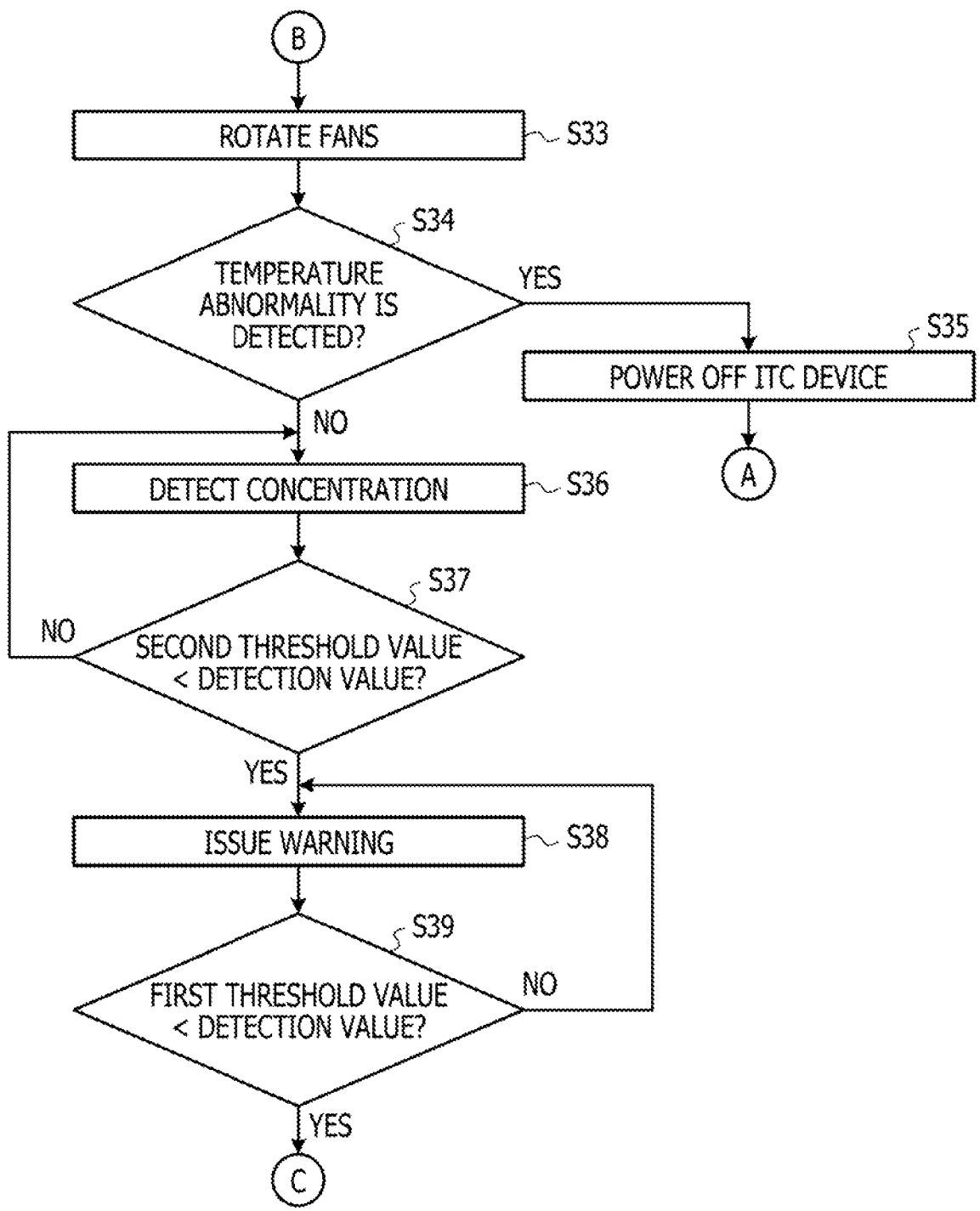

Next, a fourth embodiment will be described with reference to FIGS. 13 to 16. Referring to FIG. 13, in the fourth embodiment, a burning stop apparatus 63 is included instead of the burning stop apparatus 11 according to the first embodiment. The burning stop apparatus 63 includes, in addition to the elements of the burning stop apparatus 11, a lid opening-closing monitoring sensor 21, a lid locking mechanism 22, and a control unit 23. Among these, the lid locking mechanism 22 and the control unit 23 are elements included in the second embodiment. The burning stop apparatus 63 further includes a duct 31 including blowing ports 31a, a fan unit 32, and fans 32b for circulating air between the duct 31 and the fan unit 32. These are elements included in the third embodiment. Among these elements, the elements other than the lid opening-closing monitoring sensor 21 are identical to those in the second and third embodiments, and the elements other than these are not different from those in the first embodiment. Therefore, the identical elements are denoted by the same reference numerals in the drawings, and detailed description thereof is omitted.

The lid opening-closing monitoring sensor 21 detects whether the lid 6 is open or closed. The lid opening-closing monitoring sensor 21 is electrically coupled to the control unit 23 via a wiring 21a.

Figure 15:
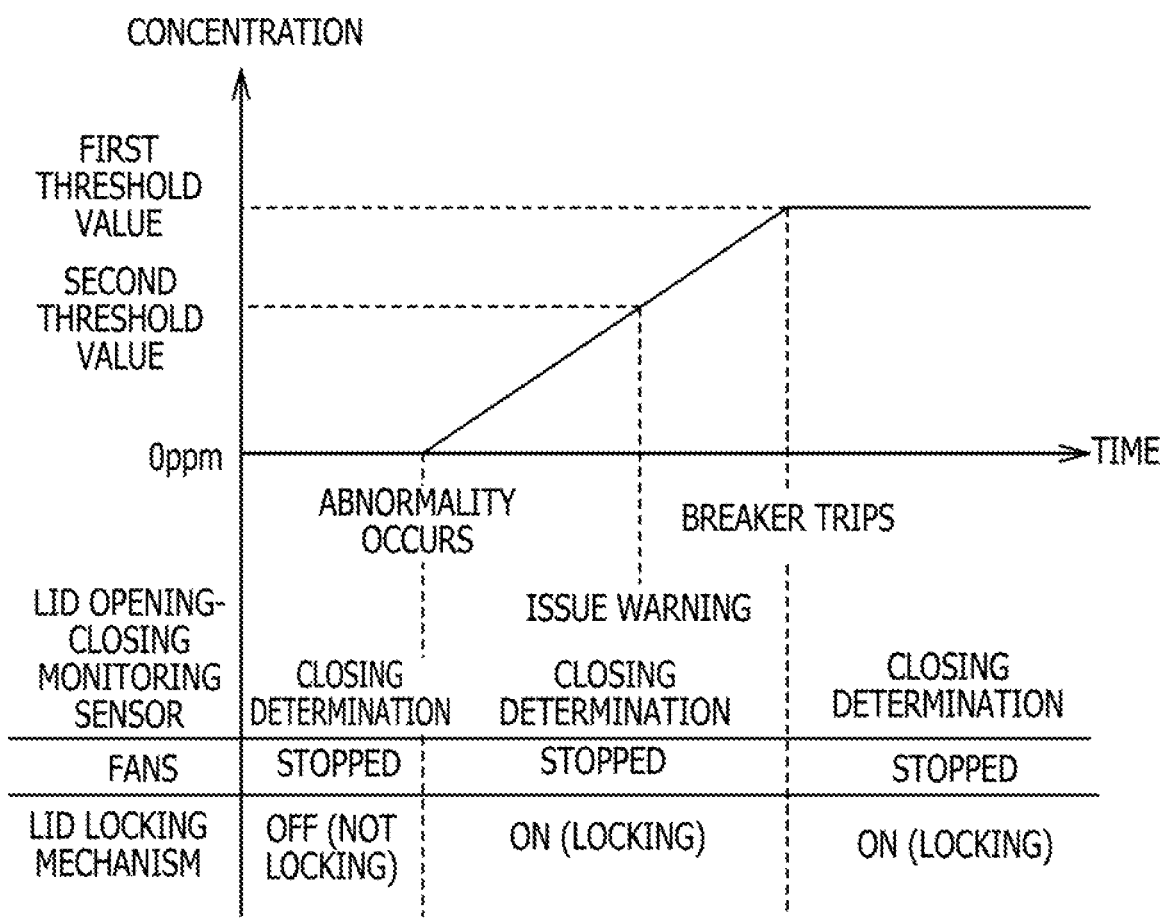
FIG. 15 is an explanatory diagram illustrating time-series change in the concentration of a gas component inside the liquid immersion tank, and the states of elements of the burning stop apparatus according to the fourth embodiment.
Figure 16:
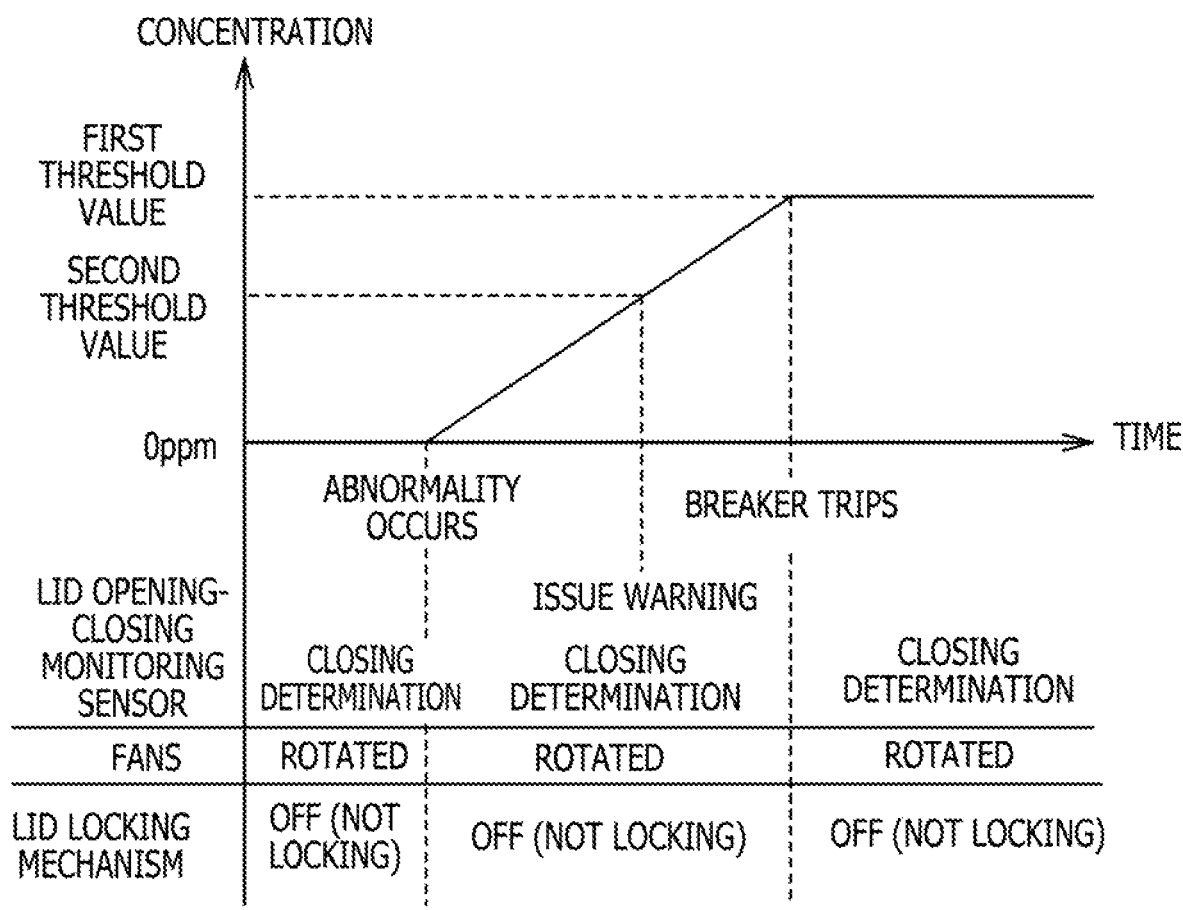
FIG. 16 is an explanatory diagram illustrating time-series change in the concentration of the gas component inside the liquid immersion tank, and the states of the elements of the burning stop apparatus according to the fourth embodiment.

Next, operation of the above burning stop apparatus 63 will be described with reference to a flowchart illustrated in FIGS. 14A and 14B and FIGS. 15 and 16. FIG. 15 is an explanatory diagram illustrating time-series change in the concentration of the gas component in the liquid immersion tank 2 with the lid 6 closed, and the states of elements of the burning stop apparatus 63. FIG. 16 is an explanatory diagram illustrating time-series change in the concentration of the gas component in the liquid immersion tank 2 with the lid 6 open, and the states of the elements of the burning stop apparatus 63.

First, in steps S21 and S22, the lid 6 is closed, and the fans 32b are put in a stopped state. Specifically, as illustrated in FIG. 15, the lid opening-closing monitoring sensor 21 indicates a closed determination, the fans 32b are stopped, and the lid locking mechanism 22 is in the off state, for example. This state is the initial state at the start of the operation.

In step S23, which is performed after step S22, the control unit 23 determines whether the lid 6 is open based on the result of the detection by the lid opening-closing monitoring sensor 21. Since the lid 6 is closed in the initial state, a negative determination is made in step S23 unless a person in charge of maintenance has opened the lid 6. On the other hand, if a person in charge of maintenance has opened the lid 6, a positive determination is made in step S23.

If a negative determination is made in step S23, the operation proceeds to step S24. The processes in steps S24 to S32 are identical to those in steps S12 to S20 in the second embodiment illustrated in FIG. 7, and detailed description thereof is therefore omitted. While the lid 6 is closed and the lid opening-closing monitoring sensor 21 is detecting that state, the fans 32b are stopped. While the lid 6 is closed, the gas component in the liquid immersion tank 2 is not released to the atmosphere, and therefore the fan unit 32 and the duct 31 do not have to be used to circulate air. For this reason, the fans 32b are put in a stopped state while the lid 6 is closed. Accordingly, the power consumption is reduced.

When generation of the gas component is detected with the lid 6 closed, the lid locking mechanism 22 operates to thereby keep the lid 6 from being opened.

On the other hand, if a positive determination is made in step S23, the operation proceeds to step S33. When the operation proceeds to step S33, the lid 6 is open, and the lid opening-closing monitoring sensor 21 detects that state. Then, the control unit 23 transmits a signal to operate the fans 32b. As a result, the fans 32b are rotated, thereby starting to capture the gas component with the lid 6 open, as described in the third embodiment. After the fans 32b start to rotate in step S33, the operation proceeds to step S34. The processes in steps S34 to S39 and step S32 after a positive determination is made in step S39 are identical to those in steps S1 to S7 in the first embodiment illustrated in FIG. 4, and detailed description thereof is therefore omitted.

As described above, with the burning stop apparatus 63 according to the present embodiment, if burning occurs with the lid 6 closed, the lid 6 is kept from being opened, thereby avoiding release of the gas component to the atmosphere. This makes the detection by the detector 12 possible. Even if the lid 6 is open, the fan unit 32 operates and therefore the detection of the gas component by the detector 12 is possible.

Although the preferred embodiments of the present disclosure have been described in detail above, the present disclosure is not limited to the particular embodiments, and various modifications and changes may be made within the scope of the gist of the present disclosure described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A burning stop apparatus comprising:
   a detector that detects a gas component generated by burning occurring in an electronic device immersed in a coolant stored in a liquid immersion tank;
   a first pipe that introduces the gas component in the liquid immersion tank to the detector;
   a second pipe that returns the gas component introduced to the detector into the liquid immersion tank;
   a breaker that cuts off supply of power to the electronic device when a detection value of the detector is higher than a preset first threshold value for concentration of the gas component;
   a lid provided to the liquid immersion tank; and
   a lid locking mechanism that keeps the lid from being opened when it is determined based on the detection value of the detector that burning is occurring in the electronic device inside the liquid immersion tank.

2. The burning stop apparatus according to claim 1, further comprising a warning issuance unit that issues a notification indicating that the gas component is being generated in the liquid immersion tank when the detection value of the detector is higher than a preset second threshold value for the concentration of the gas component, wherein the breaker cuts off the supply of power to the electronic device when the detection value of the detector is higher than the preset first threshold value, which is larger than the preset second threshold value for the concentration of the gas component.

3. The burning stop apparatus according to claim 1, further comprising:
   a suction part provided at one edge of the liquid immersion tank and having a suction port through which to suck in air inside the liquid immersion tank;
   a duct disposed at another edge facing the one edge, and including a blowing port through which to blow air toward the one edge; and
   a fan that circulates air between the suction part and the duct, wherein the first pipe introduces the air circulated by the fan to the detector.

4. The burning stop apparatus according to claim 3, further comprising:
   a lid provided to the liquid immersion tank;
   a lid opening-closing monitoring sensor that detects an open-closed state of the lid; and
   a controller that causes the fan to operate while the lid opening-closing monitoring sensor detects that the lid is in an open state, and stops the fan while the lid opening-closing monitoring sensor detects that the lid is in a closed state.

5. The burning stop apparatus according to claim 3, further comprising a lid provided to the liquid immersion tank, wherein the suction part is provided on an inner wall surface of the lid.

6. The burning stop apparatus according to claim 3, further comprising a third pipe coupling the suction part and the duct to each other.

7. The burning stop apparatus according to claim 3, wherein the fan is incorporated in the suction part.

8. A liquid immersion cooling system comprising:
   a liquid immersion tank that stores a coolant in which an electronic device is immersed;
   a detector that detects a gas component generated by burning occurring in the electronic device immersed in the coolant stored in the liquid immersion tank;
   a first pipe that introduces the gas component in the liquid immersion tank to the detector;

a second pipe that returns the gas component introduced to the detector into the liquid immersion tank;

a breaker that cuts off supply of power to the electronic device when a detection value of the detector is higher than a preset first threshold value for concentration of the gas component;

a lid provided to the liquid immersion tank; and a lid locking mechanism that keeps the lid from being opened when it is determined based on the detection value of the detector that burning is occurring in the electronic device inside the liquid immersion tank.

\* \* \* \* \*